United States Patent [19]

Shimotori et al.

[11] 4,255,756
[45] Mar. 10, 1981

[54] SUBSTRATE BIAS GENERATOR

[75] Inventors: Kazuhiro Shimotori; Takao Nakano; Yasuzi Nagayama, all of Itami, Japan

[73] Assignee: Mitsubishi Denki Kabushiki Kaisha, Tokyo, Japan

[21] Appl. No.: 109,399

[22] Filed: Jan. 3, 1980

[30] Foreign Application Priority Data

Jan. 5, 1979 [JP] Japan ................................. 54-883

[51] Int. Cl.³ ........................................... H01L 27/02
[52] U.S. Cl. ........................................ 357/51; 357/41; 357/23; 307/304
[58] Field of Search .......................... 357/41, 51, 23; 307/304

[56] References Cited
U.S. PATENT DOCUMENTS

| | | | |
|---|---|---|---|
| 3,794,862 | 2/1974 | Jenne | 307/304 |
| 4,183,040 | 1/1980 | Rideont | 357/41 |
| 4,197,554 | 4/1980 | Meusburger | 357/51 |
| 4,224,635 | 9/1980 | Mauthe | 357/41 |

OTHER PUBLICATIONS

1976 IEEE Int. Solid State Circuits Conf. (Digest), pp. 138, 139, 238.

*Primary Examiner*—Martin H. Edlow
*Attorney, Agent, or Firm*—Wenderoth, Lind & Ponack

[57] ABSTRACT

The disposed substrate bias generator comprises a capacitor including an electrically insulating film sandwiched between two electrodes one of which is disposed on one main face of a p⁻ semiconductor substrate through another electrically insulating film, and a first, a second and a third N⁺ semiconductor region disposed in spaced relationship on the same main face. The first and second regions form a grounded source and a drain of an MOSFET connected to both its gate and one of the electrodes of the capacitor. The second and third regions form a source and a drain of another MOSFET connected to both its gate and the other main face of the substrate. A signal is applied to the other electrode of the capacitor.

5 Claims, 10 Drawing Figures

FIG. 9
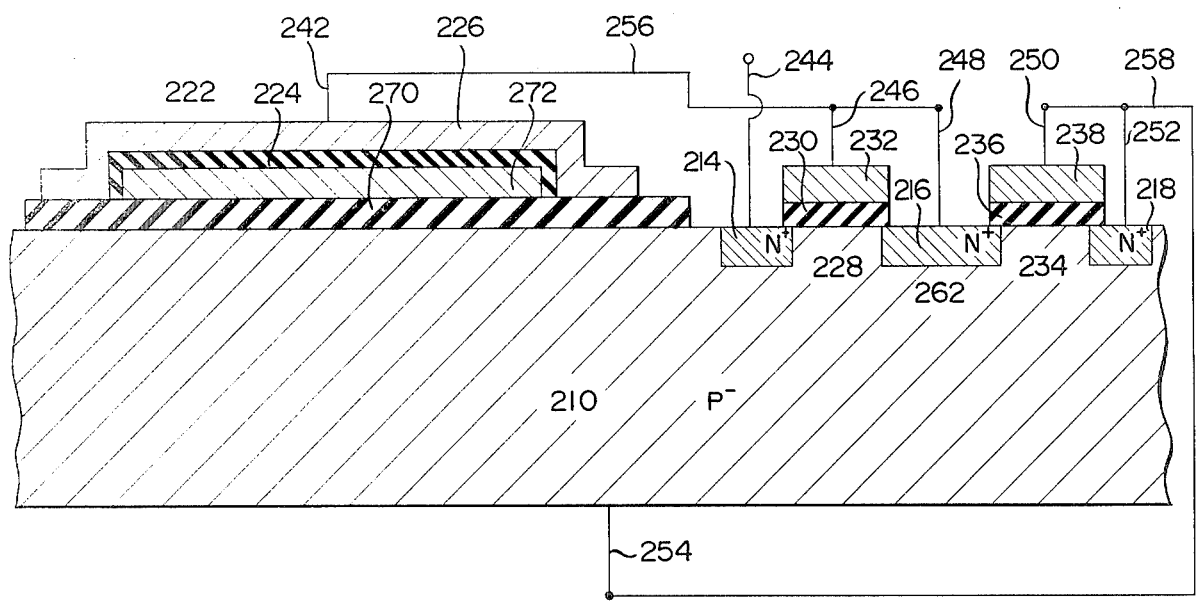
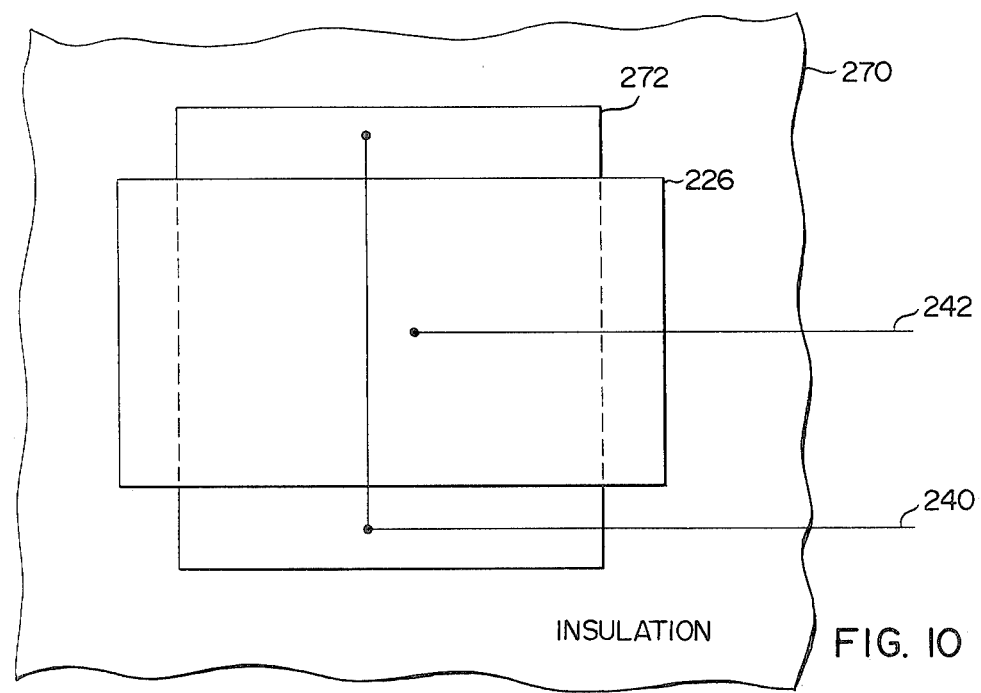
FIG. 10

SUBSTRATE BIAS GENERATOR

BACKGROUND OF THE INVENTION

This invention relates to a substrate bias generator for producing a potential in a semiconductor substrate, and more particularly to such a generator used with a dynamic memory cell in the form of an integrated circuit including, as the fundamental element, at least one MOS field effect transistor which is abgreviated hereinafter to an "MOSFET".

Conventional substrate bias generators have comprised the MOS capacitor and one pair of serially connected MOSFET's with the gate electrode connected to the drain electrode disposed on one of opposite main faces of the P− type semiconductor substrate and interconnected so that the MOS capacitor is connected to the junction of the MOSFET's and one of the MOSFET's includes a source electrode normally put at a ground potential while the other MOSFET has the drain electrode connected to an electrode on the other main face of the substrate. Therefore a parastic diode is formed between a pair of N+ type semiconductor regions forming an electrode for the MOS capacitor and a combined drain and source region of both MOSFET's respectively and the substrate. While those regions and the substrate are attended with parastic capacitances to ground.

With a voltage in the form of a square pulse applied to the MOS capacitor to put the substrate bias generator in operation, electrons due to an electric charge on the parastic capacitor attendant on the substrate are injected into the substrate through the parastic diodes, on the one hand, and through the other MOSFET and the other main face of the substrate, on the other hand. That portion of the electrons passed through the parastic diodes are soon recombined with holes forming majority carries within the substrate to disappear while that portion thereof passed through the MOSFET are instantaneously recombined with holes on a portion of the other main face of the substrate contacting the electrode thereon. Therefore the shortage of holes is developed in the substrate resulting in the generation of a negative potential in the substrate. This substrate potential is developed on the electrode on the other main face of the substrate.

Conventional substrate bias generators such as described above have been difficult to be used with the dynamic memory cell in the form of an integrated circuit disposed on the same semiconductor chip as the generator. It is assumed that the dynamic memory cell includes a single MOSFET and a single MOS capacitor serially connected to each other and stores data expressed by a binary ONE by having the MOS capacitor charged to a high potential. Under these assumed condition, some of the electrons passed through the parastic diodes in a mating substrate potential device might be caught by the MOS capacitor in the cell. As a result, the MOS capacitor changes from the high potential to a low potential which may reach a ground potential corresponding to a binary ZERO as the case may be. This has resulted in malfunction of the dynamic memory cell that a binary ZERO is read out although the binary ONE ought to have been written in the cell.

Accordingly, it is an object of the present invention to provide a new and improved substrate bias generator for producing a potential in a semiconductor substrate disposed in an integrated circuit on a semiconductor chip to permit a very small number of electrons to be injected into an associated semiconductor substrate to cause the principal factor for malfunctioning a dynamic memory cell in the form of an integrated circuit disposed on the same chip as the generator.

SUMMARY OF THE INVENTION

The present invention provide a substrate bias generator for generating a potential in a semiconductor substrate, comprising a semiconductor substrate of a first type conductivity including a pair of first and second main faces opposite to each other, a first, a second and a third semiconductor region of a second type conductivity disposed at predetermined intervals on the first main face of the semiconductor substrate, a first MOSFET disposed on the first main face of the semiconductor substrate and including a source region formed of the first semiconductor region, a drain region formed of said second semiconductor region and a gate electrode, a second MOSFET disposed on the first main face of the semiconductor substrate and including a source region formed of the second semiconductor region, a drain region formed of the third semiconductor region, and a gate electrode, a capacitor disposed on the first main face of the semiconductor substrate through an electrically insulating film, the capacitor including a pair of opposite electrodes and another electrically insulating film interposed between the electrodes, a first electrical lead for connecting one of the electrodes of the capacitor to the gate electrode and drain region of the first MOSFET, and a second electric lead for connecting the gate electrode and drain region of the second MOSFET to an electrode connected to the second main face of the semiconductor substrate, said capacitor having a signal applied to the other electrode thereof, the first MOSFET having source electrode connected to a ground potential.

In a preferred embodiment of the present invention the capacitor may include one electrode disposed on the first main face of the semiconductor substrate through the electrically insulating film and connected to the gate electrode and the drain region of the first MOSFET through the first electric lead and the other electrode disposed on the one electrode through the abovementioned another electrically insulating film and applied with the signal.

BRIEF DESCRIPTION OF THE DRAWINGS

The present invention will become more readily apparent from the following description taken in conjunction with the accompanying drawings in which:

FIG. 9 is a view similar to FIG. 7 but illustrating a modification of the present invention;

FIG. 10 is a plan view of one portion of the arrangement shown in FIG. 9.

DESCRIPTION OF THE PREFERRED EMBODIMENTS

Figure 1:
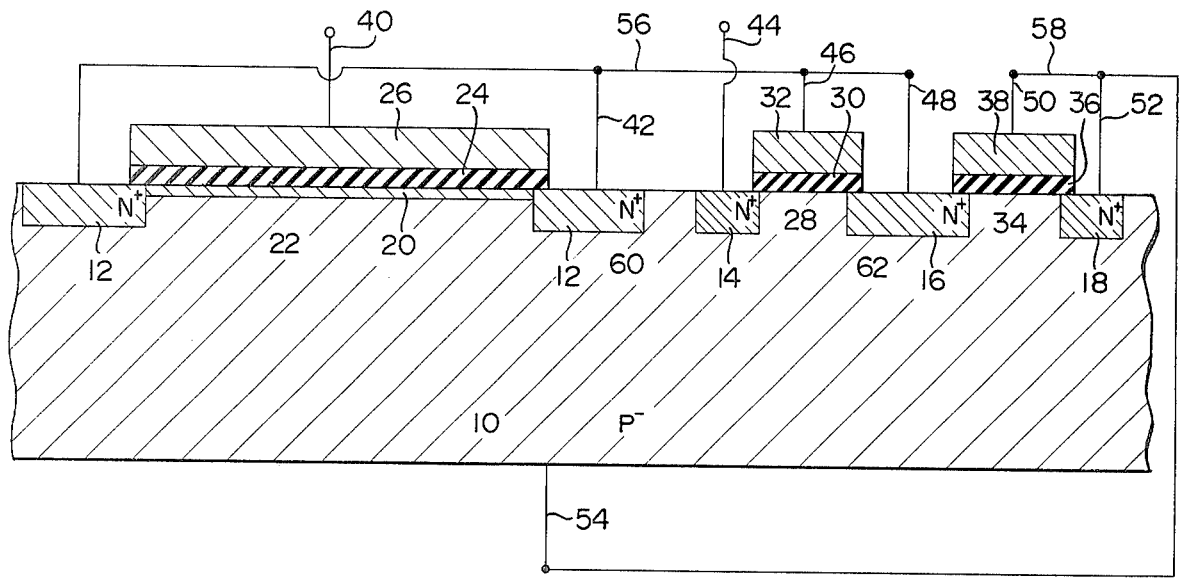
FIG. 1 is a longitudinal sectional view of a conventional substrate bias generator for producing a potential in a semiconductor substrate.

Referring now to FIG. 1 of the drawings, there is illustrated a conventional substrate bias generator for producing a potential in a semiconductor substrate. The arrangement illustrated comprises a P⁻ type semiconductor substrate 10 having a high resistivity and including a pair of first and second main faces opposite to each other, and a plurality of N⁺ type low resistivity semiconductor regions, in this case, five regions 12, 14, 16 and 18 disposed at a predetermined intervals on the first main face, in this case, the upper main face of the substrate 10. The two N⁺ type semiconductor regions 12 are interconnected through an N type type semiconductor layer 20 disposed on the upper main face of the substrate to act as an electrode for an MOS type capacitor 22 including a thin electrically insulating film 24 underlaid with the N type semiconductor layer 20 and adjacent portions of the semiconductor regions 12 and a region 26 disposed on the electrically insulating film 24. The electrically insulating film 24 is, in many cases, formed of silicon dioxide and is called hereinafter a "gate oxide film" and the region 26 is formed of polycrystalline silicon, aluminum or molybdenum.

The N⁺ type semiconductor regions 14 and 16 form respectively a source and a drain region of a first MOSFET 28 including a gate oxide film 30 similar to the gate oxide film 24 and disposed on the upper main face of the substrate 10 so as to bridge the regions 14 and 16 and a region 32 formed on the gate oxide film 30 of polycrystalline silicon or the like. The gate oxide film 30 and the region 32 form a part of the gate region of the MOSFET 28.

The N⁺ type semiconductor region 16 also forms a source region of a second MOSFET 34 including a gate oxide film 36 similar to the gate oxide film 30 and a region 38 similar to the region 32 while the N⁺ type semiconductor region 18 forms the drain region of the MOSFET 34. The gate oxide film 36 similarly forms a part of the gate region of the MOSFET 34 with the region 38.

Then an electrode 40 is connected to the region 26 forming the other electrode of the MOS capacitor 22 and electrodes 42 are connected to the N⁺ type semiconductor region 12 respectively and to each other. A source a gate and a drain electrode 44, 46 and 48 are connected to the source region 14, the region 32 and the drain regions of the first MOSFET 28 respectively. Similarly, a gate and a drain electrode 52 are connected to the region 38 and the drain region 18 of the second MOSFET 34. Further an electrode 54 is connected to the second or lower main face of the semiconductor substrate 10.

Then the electrodes 42, the gate electrode 32 and the drain electrode 48 are connected to one another through a first electric lead 56 while the gate electrode 50, the drain electrode 52 and the electrode 54 are connected to one another through a second electric lead 58.

Figure 2:
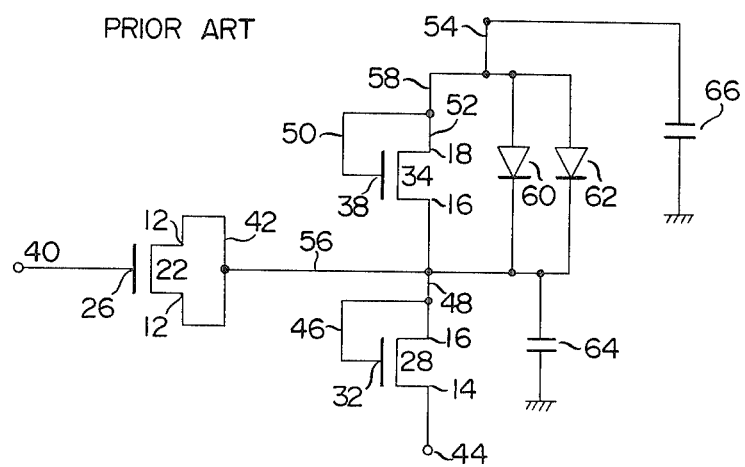
FIG. 2 is a circuit diagram equivalent to the arrangement shown in FIG. 1.

FIG. 2 shows a circuit equivalent to the arrangement of FIG. 1. In FIG. 2 like reference numerals designate the components identical to those shown in FIG. 1 and therefore the connection of the components will readily be understood from the foregoing description made in conjunction with FIG. 1. In FIG. 2 a parastic diode 60 is shown as being formed between the N⁺ type semiconductor regions 12 and the P⁻ type semiconductor substrate 10 due to a PN junctions formed therebetween and a parastic diode 62 is shown as being formed between the N⁺ type semiconductor region 16 and the P type semiconductor substrate 10 due to a PN junction formed therebetween. Further a parastic capacitances 64 and 66 to ground are attendant on the N⁺ type semiconductor regions 12, 16 and the semiconductor substrate 10 respectively.

The operation of the arrangement shown in FIGS. 1 and 2 will now be described. For a better understanding of the subject matter of the present invention, it is useful to describe first the role of the electrode 54 connected to the semiconductor substrate 10.

In integrated circuits employing MOSFET's signals are generally transmitted therethrough by charging and discharging the source electrode and/or the drain electrode of MOSFET's, and the higher the charging and discharging rates the more the operation of the integrated circuits is speeded up. For example, random access memory devices are required to shorten in access time. One of the important factors for determining the charging and discharging rates is a junction capacitance of a PN junction relative to the particular semiconductor substrate attendant on either of the source and drain regions of each MOSFET involved. The smaller this junction capacitance the less the charging and discharging rates will be. The junction capacitance $C_J$ may be generally expressed by $$C_J = K/\sqrt{V_o - V} \qquad (1)$$

where $V_o$ designates a built-in potential at the PN junction and is normally of about 0.6 volts, V a voltage across either of the source and drain regions of the MOSFET and the semiconductor substrate and holds $V < 0$, and K designates a constant as determined by the type of a semiconductive material involved and the dimension of the MOSFET. Since the $V_o$ and K are constants as determined by the type of the semiconductive material and the dimension of the MOSFET's, the junction capacitance $C_J$ is permitted to decrease only with a small degree of freedom. This means that the junction capacitance $C_J$ can decrease only by increasing the voltage V negatively.

On the other hand, MOSFET's have the source (or drain) voltage whose magnitude generally ranges from a ground potential to a voltage across an electric source used with the particular integrated circuit, for example, +5 volts. Assuming that a substrate potential is equal to the ground potential, a potential difference V between the source (or drain) voltage and a voltage applied to the semiconductor substrate has a magnitude between the ground potential and −5 volts. On the contrary, with a voltage of, for example, −3 volts applied to the semiconductor substrate, that potential difference V has a magnitude of from −3 to −8 volts. In the latter case, the expression (1) indicates that the junction cpacitance $C_J$ becomes small resulting in the attainment of the high speed operation.

For this reason, an external electric source has been previously used to apply a potential to an associated semiconductor substrate through an electrode such as the electrode 54 shown in FIG. 1. The arrangement of FIG. 2, however, has produced a negative voltage on an associated integrated circuit formed of MOSFET's. For example, the electrode 40 shown in FIG. 2 has been applied with an output signal delivered from an oscillator such as a ring oscillator, a trigger circuit or the like disposed on an integrated circuit.

Figure 3:
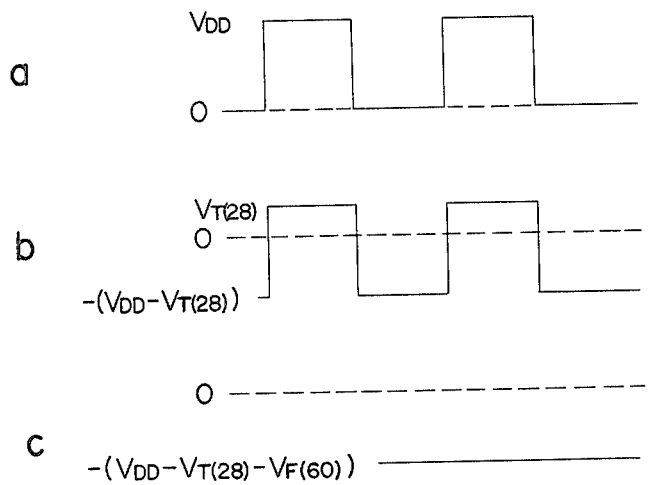
FIG. 3 is a graph illustrating waveforms developed at various points in the arrangement shown in FIG. 2.

The output signal may be of square waveform as shown in FIG. 3. In the example illustrated, this output signals is shown as forming a source voltage $V_{DD}$ supplied to the arrangement shown in FIG. 1 as being constructed into an integrated circuit. However, it is to be noted that the undermentioned description is equally applicable to other cases.

When a signal such as shown at waveform $V_{DD}$ in FIG. 3 is applied to the electrode 40, the electric lead 56 is put at a potential having an amplitude $V_P$ expressed by $$V_P = C_{22} V_{DD} / (C_{22} + C_{64}) \quad (2)$$

where $C_{22}$ designates a capacitance of the MOS capacitor 22 and $C_{64}$ designates the parasitic capacitance 60. This amplitude $V_P$ results from the capacitive coupling of the electrode 40 to the electric lead 56 through the MOS capacitor 22. Since $C_{22} > C_{64}$ generally holds, the expression (2) can approximate the following expression (3):

$$V_P \approx V_{DD} \quad (3)$$

Considering that the source electrode 42 of the MOSFET 28 is generally put at a ground potential, that MOSFET is brought into its conducting state with the potential on the electric lead 56 equal to about the threshold voltage $V_T(28)$ of the MOSFET 28.

Accordingly, the potential on the electric lead 56 has a magnitude changed between $V_T(28)$ and $-(V_P - V_T(28)) \approx -(V_{DD} - V_T(28))$ as shown at square waveform b in FIG. 3. When the steady state is approximately reached, the MOSFET 32 and the diodes 60 and 62 are put in their nonconducting state with the potential on the lead 52 approximating the threshold voltage $V_T(28)$ of the MOSFET 28. On the other hand, for the potential on the lead 52 equal to $-(V_{DD} - V_T(28))$, the MOSFET 32 and the diodes 60 and 62 are brought into their conducting state. Under these circumstances, an electric charge from the capacitance 66 is transferred to the electrode 40 through the now conducting MOSFET 34, on the one hand, and the now conducting diodes 60 and 62, on the other hand, and thence through the MOS capacitor 22. This results in the discharge of the capacitance 66. As a result of this discharge, the substrate potential has a magnitude selectively expressed by $$-(V_{DD} - V_T(28) - V_T(34)) \quad (4)$$

$$-(V_{DD} - V_T(28) - V_F(60)) \quad (5)$$

and $$-(V_{DD} - V_T(28) - V_F(62)) \quad (6)$$

dependent upon relative magnitudes of $V_T(34)$, $V_F(60)$ and $V_F(62)$ where $V_T(32)$ designates the threshold voltage of the MOSFET 34 and $V_F(60)$ and $V_F(62)$ designate forward voltage drops across the diodes 60 and 62 respectively.

Figure 4:
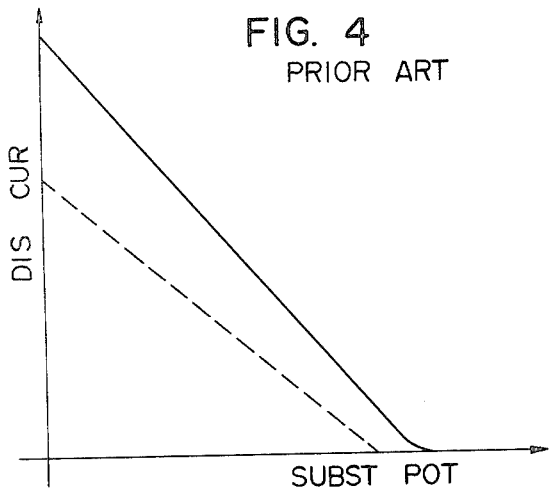
FIG. 4 is a graph illustrating the relationship between a current discharged from the semiconductor substrate and the potential produced in the substrate of the arrangement shown in FIGS. 1 and 2.

FIG. 4 shows a mean discharging current in ordinate plotted against the substrate potential in abscissa for $V_T(34) > V_F(60) = V_F(62)$. In FIG. 4 solid curve depicts that current component of the discharging current discharged through the diodes 60 and 62 while dotted curve depicts that current component thereof discharged through the MOSFET 34.

When $V_T(34) > V_F(60) = V_F(62)$ holds, the substrate potential is discharged to $-(V_{DD} - V_T(28) - V_F(60))$ in the steady state. As a result, the substrate potential has the ultimate magnitude as shown at waveform C or the lowermost solid line in FIG. 4.

On the other hand, when $V_T(34) < V_F(60) = V_F(62)$ holds, the discharging current from the capacitor 66 includes a current component through the diodes 60 and 62 smaller than that through the MOSFET 34. Therefore the substrate potential has the ultimate magnitude expressed by $-(V_{DD} - V_T(28) - V_T(32))$ in the steady state.

From the foregoing it is seen that the substrate bias generator as shown in FIG. 1 performs such an operation that electrons are injected into the P type semiconductor substrate through the parasitic diodes 60 and 62, on the one hand, and the electrons passed through the MOSFET 34 reach the electrode 54 connected to the second or lower main face of the substrate, on the other hand. Therefore the shortage of holes is established in the substrate resulting in the substrate potential reaching a negative magnitude. More specifically, the electrons injected into the substrate through the diodes 60 and 62 live within the substrate for a short time interval after which they disappear through their recombination with holes which form majority carriers in P type semiconductive materials. On the other hand, electrons reaching the second main face of the substrate through the MOSFET 34 instantaneously disappear through their recombination with holes effected on that portion of the electrode 54 contacting the second main face of the substrate. Accordingly, the semiconductor substrate is brought into its storage-of-holes state corresponding to the number of holes recombined with the injected electrons.

In substrate bias generators such as shown in FIGS. 1 and 2 electrons are injected in the semiconductor substrate through parasitic diodes such as the diodes 60 and 62 as described above. Therefore such generators have been difficult to be used with dynamic memory circuits integrated therewith on the same semiconductor chip. In other words, when the electrons injected into the semiconductor substrate are caught by a node located in such a dynamic memory cell to store data therein, there might occur a danger that such electrons would give rise to malfunction of the cell due to the influence of the injected electrons on the dynamic memory cell. This situation will now be described in conjunction with FIG. 5 wherein there is illustrated, by way of example, a dynamic memory cell including a single MOSFET nad a single MOS type capacitor.

Figure 5:
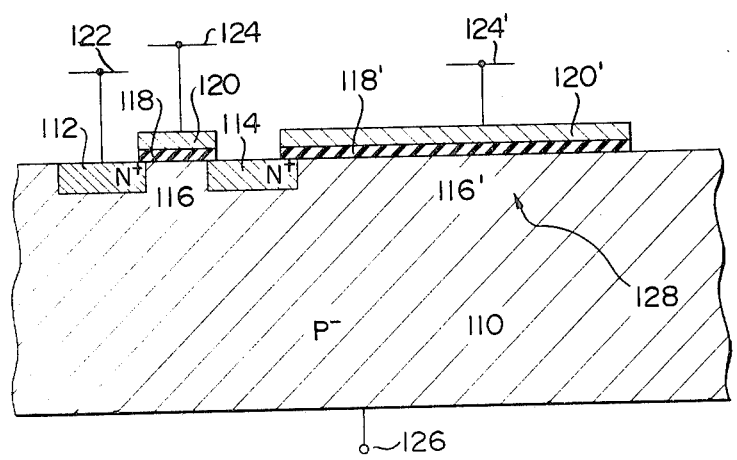
FIG. 5 is a longitudinal sectional view of a dynamic memory cell to which the present invention is applicable.

The arrangement illustrated comprises a P⁻ type semiconductor substrate 110 having a high resistivity and including a pair of opposite main faces, and a pair of N+ type low resistivity semiconductor regions 112 and 114 disposed on one of the main faces, in this case, the upper main face as viewed in FIG. 5 of the substrate 110 to form a predetermined spacing therebetween. The N+ type semiconductor regions 112 and 114 act as a drain and a source region of an MOSFET 116 including a gate oxide film 118 underlaid with that portion of the upper main face of the substrate 110 defined by the semiconductor regions 112 and 114 and the adjacent portions of the latter, and a gate electrode 120 disposed on the gate oxide film 118. The drain region 112 is connected to an electric lead 122 which is called a "bit line" and the gate electrode 120 is connected to an electric lead 124 called a "word line".

Then another gate oxide film 118' overlaid with another gate electrode 120' is disposed on the upper main face of the substrate 110 so that one end thereof is located on the end portion of the semiconductor region 114 remote from the gate oxide film 118 and the other end thereof is spaced from the region 114 by a predetermined distance. The gate oxide film 118' and gate electrode 120' form parts of an MOS type capacitor 116' as will be described later. The gate electrode 120' is connected to an electric lead 124' having normally applied thereto a maximum voltage, for example of +5 volts used with the arrangement of FIG. 5.

When a voltage of +5 volts is applied to the electrode 120'; electrons are induced on that portion of the upper main face of the P− type semiconductor substrate 110 located directly under the gate oxide film 118' and connected to the source region 114 of the MOSFET 116. Therefore the MOS type capacitor 106' is formed between the source region 114 and the gate electrode 120'.

Also an electrode 126 is connected to the other or lower main face of the substrate 110.

Figure 6:
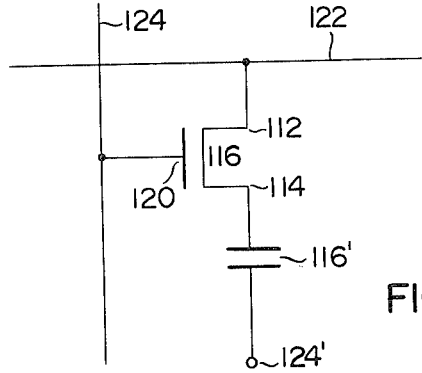
FIG. 6 is a circuit diagram equivalent to the arrangement shown in FIG. 5.

Accordingly, the arrangement of FIG. 5 has an equivalent circuit as shown in FIG. 6 wherein like reference numerals designate the components identical to those illustrated in FIG. 5.

In order to write data with a high potential corresponding to a binary ONE into the dynamic memory cell as shown in FIGS. 5 and 6, the bit line 122 is put at a high potential. Then the word line 124 is put at a high potential to bring the MOSFET 116 into its conducting state. This conduction of the MOSFET 116 causes the potential in the bit line 122 to be transferred to the source region 114 of the MOSFET 116. Therefore the MOS type capacitor 116' is charged to the high potential. At that time the number of electrons becomes very small within the MOS capcitor 116'.

Then the word line 124 is returned back to a low potential whereupon the MOSFET 116 is put in its nonconducting state. Accordingly, the bit line 122 is electrically isolated from the source region 114 with the result that the MOS type capacitor 116' charged to the high potential is left intact. At that time, the memory cell stores and holds written data corresponding to the binary ONE.

Under these circumstances it is assumed that the substrate bias generator shown in FIGS. 1 and 2 is operated to inject electrons into the substrate 10 through the diodes 60 and 62. Under the assumed conditions, some of the electrons thus injected may reach the vicinity of the MOS type capacitor 116' as shown at the arrow 128 in FIG. 5. As those electrons form minority carriers within the P− type semiconductor substrate 110, the electrons are normally recombined with holes and disappear while the electrons are not so spaced from a source into which they have been injected. According to circumstances, however, some of the injected electrons reach the vicinity of the memory cell. Assuming that such electrons are caught by the MOS type capacitor 116' charged to the high potential thereby to have a very small number of electrons, a charged voltage across the MOS type capacitor 116' changes from its high to its low magnitude which may be equal to a ground potential as the case may be. This results in a malfunction that, as the ground potential corresponds to data expressed by a binary ZERO, the written data are read out, as a binary ZERO, from the memory cell although the binary ONE ought to be written therein. This means that conventional substrate bias generators such as shown in FIGS. 1 and 2 have been vitally disadvantageous in that an associated dynamic memory cell is brought into malfunction.

Figure 7:
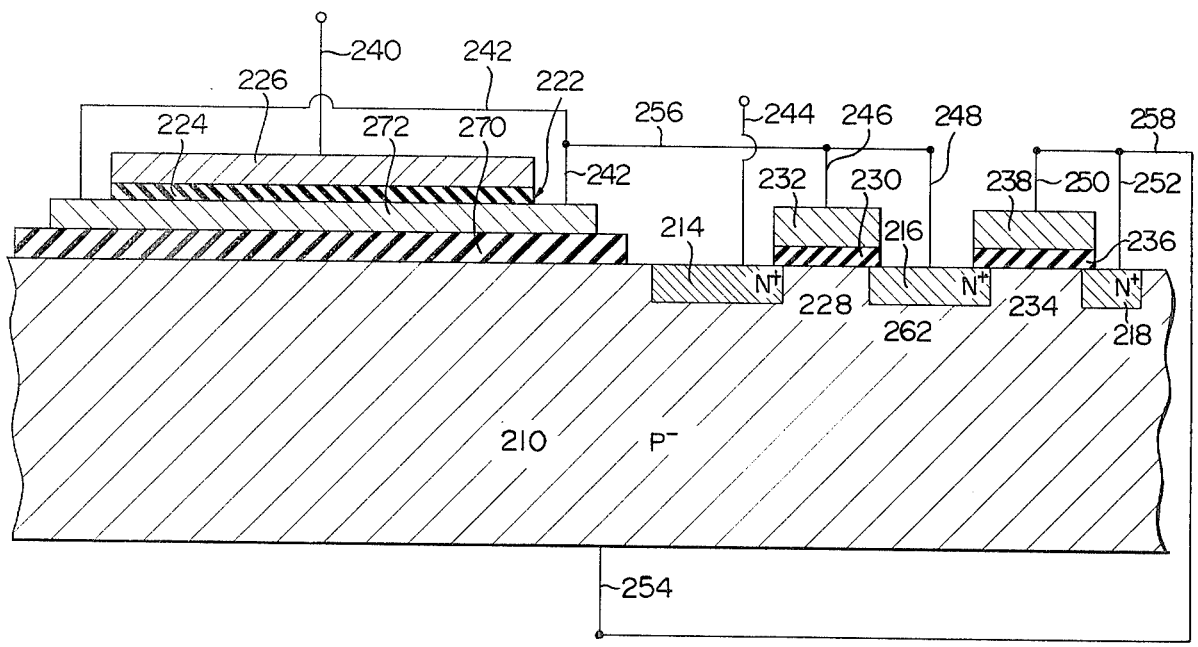
FIG. 7 is a longitudinal sectional view of one embodiment of a substrate bias generator for producing a potential in a semiconductor substrate according to the present invention.

Referring now to FIG. 7, there is illustrated one embodiment of a substrate bias generator for generating a potential in a semiconductor substrate according to the present invention. The arrangement illustrated is different from that shown in FIG. 1 only in that in FIG. 7 a parallel plate type capacitor is substituted for the MOS type capacitor shown in FIG. 1. Therefore like reference numerals of the 200 series have been employed to identify the components identical or corresponding to those shown in FIG. 1 and the description will now be made in conjunction with only a difference between the arrangements shown in FIGS. 1 and 7 respectively.

In the arrangement of FIG. 7 the MOS type capacitor 20 shown in FIG. 1 is omitted and instead a silicon dioxide film 270 is disposed on the upper main face of the P− type semiconductor substrate 210 to extend substantially between positions occupied by the outer sides of the opposite N+ type semiconductor regions 12 which have been now omitted with the N type semiconductor layer 20 sandwiched therebetween. Thus the silicon dioxide film 270 is substituted for the gate oxide film 24 shown in FIG. 1 but thicker than the gate oxide films 230 and 236 included in the MOSFET's 228 and 324 respectively. Then a first region 272 is formed on the gate oxide film 270 of polycrystalline silicon to form a first layer. The region 272 is preferably formed according to the well known irradiation with light or an electron beam simultaneously with the regions 232 and 252 included in the MOSFET's 228 and 238 respectively. As in the MOS type capacitor 22, a silicon dioxide film 224 is disposed on the first layer 272 to cause the bilateral end portions as viewed in FIG. 7 of the first layer 270 to be exposed for the purpose as will be apparent subsequently. Then the silicon dioxide film 224 is overlaid with a second layer 226 formed of polycrystalline silicon, and the electrode 240 is connected to the second layer 226 while the electrode 242 are connected to the exposed portions of the first layer 272 and to each other. Therefore the electrodes 240 and 242 have a parallel plate capacitor 222 formed therebetween and including an electrically insulating film composed of the silicon dioxide film 224. The electrode 272 is connected to the electrodes 246 and 248 for the MOSFET 228 through the lead 256 as in the arrangement shown in FIG. 1.

Figure 8:
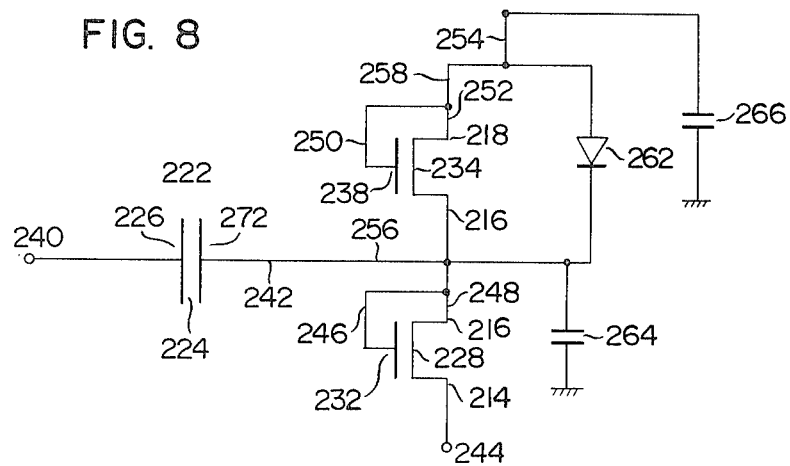
FIG. 8 is a circuit diagram equivalent to the arrangement shown in FIG. 7.

The arrangement of FIG. 7 has an equivalent circuit as shown in FIG. 8 wherein like reference numerals designate the components identical to those illustrated in FIG. 7. The equivalent circuit illustrated is different from that shown in FIG. 2 only in that in FIG. 8, a single parasitic diode 262 is formed between the N+ type semiconductor region 216 and the P− type semiconductor substrate 210 in addition to the substitution of the parallel plate type capacitor 222 for the MOS type capacitor 22.

The arrangement shown in FIGS. 7 and 8 is fundamentally identical in operation to that described above in conjunction with FIGS. 1 through 4 in view of the standpoint that the substrate bias generator is integrated with the dynamic memory cell in a common semiconductor chip.

However, as the arrangement of FIG. 7 has the parallel plate type capacitor 222 substituted for the MOS type capacitor 22 previously employed, the same does not include the PN diode 60 inevitably formed between the electrode formed of the N+ type semiconductor regions 12 included in the MOS type capacitor 22. Accordingly, a current discharged from the substrate flows through the diode 262 alone whereas such a current flows through the diodes 60 and 62 in the arrangement shown in FIGS. 1 and 2. This results in a sharp decrease an electron stream injected into the substrate.

On the other hand, an electron stream is injected into the substrate 210 through the MOSFET 234 and the lower or second main face of the substrate 210 until electrons included in the latter stream are immediately recombined with holes in the vicinity of the second main face and disappear resulting in a hole stream. This means that the electrons injected into the substrate through the PN junction are recombined with holes which form majority carriers within the substrate and disappear thereby to decrease a probability of affecting adversely the storage holding characteristics of the dynamic memory cell shown in FIGS. 5 and 6.

The foregoing is always correct regardless of a relative magnitude of the threshold voltage of the MOSFET 234 to the forward voltage drop across the diode 262.

In FIG. 9 wherein like reference numerals designate the components identical to those shown in FIG. 7 there is illustrated a modification of the present invention. The arrangement illustrated is different from that shown in FIG. 7 only in that in FIG. 9 roles of the first and second layers 272 and 226 respectively are reversed from those played thereby in the arrangement shown in FIG. 7. That is, the electrode 240 is connected to the first layer 272 while the electrode 242 is connected to the second layer 226 as shown best in FIG. 10.

As shown in FIG. 9, the second layer 236 has an inverted U-shaped cross section and bridges in intimate contact relationship the first layer 272 through the silicon dioxide film 224. The second layer 272 has folded ends of both legs of the "U" fixedly secured to the gate oxide film 270 and causes the exposure of the opposite end portions of the first layer 272 extending in the direction of width of the "U"'s legs (see FIG. 10 ). Then the electrodes 240 are connected to the exposed end portions of the first layer 272 and to each other while the electrode 242 is connected to the central portion of the second layer 226, as shown in FIG. 10.

The electrode 240 corresponds to the electrode 40 shown in FIGS. 1 and 2 and electrode 242 is connected to the junction of the MOSFET's 228 and 234.

From the foregoing it is seen that, according to the present invention, a coupling capacitor is formed of two layers of polycrystalline silicon serving as electrodes and a thin silicon dioxide film sandwiched therebetween and underlaid with a thick silicon dioxide film disposed on a first main face of a semiconductor chip thereby to be electrically insulated from the semiconductor substrate. The coupling capacitor forms a part of the substrate bias generator integrated with a dynamic memory cell disposed on the same chip as the generator. Therefore a PN junction formed between a P− type semiconductor substrate included in that chip and an associated N+ type semiconductor region is small in area as compared with the prior art practice resulting in an extremely small chance of bringing about malfunction of the dynamic memory cell.

While the present invention has been illustrated and described in conjunction with a few preferred embodiments thereof it is to be understood that numerous changes and modifications may be resorted to without departing from the spirit and scope of the present invention. For example, the present invention has been described in conjunction with the P type semiconductor substrate but it is to be understood that the same is equally applicable to N type semiconductor substrates with the conductivity type of various semiconductor regions and the polarity of the applied voltage reversed from those illustrated.

What we claim is:

1. A substrate bias generator for generating a potential in a semiconductor substrate, comprising a semiconductor substrate of a first type conductivity including a pair of first and second main faces opposite to each other, a first, a second and a third semiconductor regions of a second type conductivity disposed at predetermined intervals on said first main face of said semiconductor substrate, a first MOSFET disposed on said first main face of said semiconductor substrate and including a source region formed of said first semiconductor region, a drain region formed of said second semiconductor region and a gate electrode, a second MOSFET disposed on said first main face of said semiconductor substrate and including a source region formed of said second semiconductor region, a drain region formed of said third semiconductor region, and a gate electrode, a capacitor disposed on said first main face of said semiconductor substrate through an electrically insulating film, said capacitor including a pair of opposite electrodes and another electrically insulating film interposed between said electrodes, a first electric lead for connecting one of said electrodes of said capacitor to said gate electrode and drain region of said first MOSFET, and a second electric lead for connecting said gate electrode and drain region of said second MOSFET to an electrode connected to said second main face of said semiconductor substrate, said capacitor having a signal applied to the other electrode thereof, said first MOSFET having a source electrode connected to a ground potential.

2. A substrate bias generator as claimed in claim 1 wherein said capacitor includes one electrode disposed on said first main face of said semiconductor substrate through said electrically insulating film and connected to said gate electrode and drain region of said first MOSFET through said first electric lead, and the other electrode disposed on said one electrode through said another electrically insulating film and applied with said signal.

3. A substrate bias generator as claimed in claim 1 wherein said capacitor includes one electrode disposed on said first main face of said semiconductor substrate through said electrically insulating film and having said signal applied thereto and the other electrode disposed on said one electrode through said another electrically insulating film and connected to said gate electrode and drain region of said first MOSFET through said first electric lead.

4. A substrate bias generator as claimed in claim 1 wherein said semiconductor substrate has a P type conductivity and each of said first, second and third semiconductor zones has an N type conductivity.

5. A substrate bias generator as claimed in claim 1 wherein said semiconductor substrate has an N type conductivity and each of said first, second and third semiconductor regions has a P type conductivity.

* * * * *